(12) United States Patent
Smith et al.

(10) Patent No.: US 6,251,771 B1
(45) Date of Patent: Jun. 26, 2001

(54) HYDROGEN PASSIVATION OF CHEMICAL-MECHANICALLY POLISHED COPPER-CONTAINING LAYERS

(75) Inventors: Patricia B. Smith, Colleyville; Girish A. Dixit, Plano; Eden Zielinski, Rowlett; Stephen W. Russell, Dallas, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/255,466

(22) Filed: Feb. 22, 1999

Related U.S. Application Data

(60) Provisional application No. 60/075,583, filed on Feb. 23, 1998.

(51) Int. Cl.$^7$ ................................................. H01L 21/4763
(52) U.S. Cl. ........................ 438/626; 438/622; 438/625; 438/627; 438/628; 438/660; 438/663
(58) Field of Search ................................. 438/475, 692, 438/689, 618, 622, 631, 633, 637, 687, 625, 626, 627, 628, 660, 663

(56) References Cited

U.S. PATENT DOCUMENTS

| | | | |
|---|---|---|---|
| 5,677,244 | * | 10/1997 | Venkatraman . |
| 5,693,961 | * | 12/1997 | Hamada . |
| 5,705,435 | * | 1/1998 | Chen . |
| 5,723,383 | * | 3/1998 | Kosugi et al. . |

OTHER PUBLICATIONS

S. Wolf and R. N. Tauber, "Silicon Processing for the VLSI Era, vol. 1: Process Technology", Lattice Press, Sunset Beach, CA (1986), pp. 539–547, 559–564, 582–584.*

* cited by examiner

Primary Examiner—Charles Bowers
Assistant Examiner—Stephen W. Smoot
(74) Attorney, Agent, or Firm—Peter K. McLarty; W. James Brady, III; Frederick J. Telecky, Jr.

(57) ABSTRACT

An embodiment of the instant invention is a method of forming an electronic device over a semiconductor substrate and having at least one level of metallic conductors, the method comprising the steps of: forming a dielectric layer over the semiconductor substrate, the dielectric layer having openings (step 102 of FIG. 1); forming a layer of the metallic conductor on the dielectric layer (step 104 of FIG. 1); removing a portion of the layer of the metallic conductor on the dielectric layer (step 106 of FIG. 1); and subjecting the exposed metallic conductor to a plasma which contains hydrogen or deuterium so as to passivate the metallic conductor (step 110 of FIG. 1). Preferably, the plasma contains a substance selected from the group consisting of: $NH_3$, $N_2H_2$, $H_2S$, and $CH_4$, and the metallic conductors are comprised of a material selected from the group consisting of: copper, copper doped aluminum, Ag, Sn, Pb, Ti, Cr, Mg, Ta, and any combination thereof. The step of removing a portion of the layer of the metallic conductor is, preferably, performed by sputtering off a portion of the metallic conductor, chemical-mechanical polishing, etching, or a combination thereof.

11 Claims, 2 Drawing Sheets

HYDROGEN PASSIVATION OF CHEMICAL-MECHANICALLY POLISHED COPPER-CONTAINING LAYERS

This application claims priority under 35 USC §119(e)(1) of provisional application number 60/075,583 filed Feb. 23, 1998.

CROSS-REFERENCE TO RELATED PATENT/PATENT APPLICATIONS

The following commonly assigned patent/patent applications are hereby incorporated herein by reference: U.S. patent application Ser. No. 09/199,829 filed on Nov. 25, 1998 and U.S. patent application Ser. No. 09/199,600 filed on Nov. 25, 1998.

FIELD OF THE INVENTION

The instant invention pertains to semiconductor device fabrication and processing and more specifically to a method of passivating a copper-containing layer after it is chemical-mechanically polished.

BACKGROUND OF THE INVENTION

Future electronic devices will be required to be smaller, faster, and consume less power than present devices. One means of achieving at least one of these requirements involves the incorporation of copper in the conductive interconnects of the device. However, conductive layers which are comprised of fairly substantial amounts of copper are difficult to etch. Hence, it is difficult to form patterned structures using a material which is comprised of any appreciable amount of copper using standard etching techniques.

A method to form structures out of copper-containing conductors is referred to as a "damascene" method. The damascene method involves forming a trench and/or an opening in a dielectric layer which is to lie beneath and on either side of the copper-containing structures. Once the trenches and/or openings are formed, a blanket layer of the copper-containing material is formed over the entire device. The thickness of this layer must be at least as thick as the deepest trench and/or opening. After the trenches and/or the openings are filled with the copper-containing material, the copper-containing material over the trenches/openings is removed, preferably by chemical-mechanical polishing (CMP), so as to leave the copper-containing material in the trenches and openings but not over the dielectric or over the uppermost portion of the trench/opening.

A problem with this technique is that it does not provide for a means of inhibiting the oxidation of the copper-containing structures when the device is subjected to an oxygen ambient.

SUMMARY OF THE INVENTION

An embodiment of the instant invention is a method of passivating an oxygen-sensitive material (such as copper) from oxidation by subjecting the material to a hydrogen-containing (or deuterium-containing) plasma before subjecting the device to an oxygen ambient for any appreciable time.

An embodiment of the instant invention is a method of forming an electronic device over a semiconductor substrate and having at least one level of metallic conductors, the method comprising the steps of: forming a dielectric layer over the semiconductor substrate, the dielectric layer having openings; forming a layer of the metallic conductor on the dielectric layer; removing a portion of the layer of the metallic conductor on the dielectric layer; and subjecting the exposed metallic conductor to a plasma which contains hydrogen or deuterium so as to passivate the metallic conductor. Preferably, the plasma contains a substance selected from the group consisting of: $NH_3$, $N_2H_2$, $H_2S$, and $CH_4$, and the metallic conductors are comprised of a material selected from the group consisting of: copper, copper doped aluminum, Ag, Sn, Pb, Ti, Cr, Mg, Ta, and any combination thereof. The step of removing a portion of the layer of the metallic conductor is, preferably, performed by sputtering off a portion of the metallic conductor, chemical-mechanical polishing, etching, or a combination thereof.

Another embodiment of the instant invention is a method of forming an electronic device over a semiconductor substrate and having at least one level of metallic conductors, the method comprising the steps of: forming a dielectric layer over the semiconductor substrate, the dielectric layer having openings; forming a layer of the metallic conductors in the openings in the dielectric layer and on the dielectric layer; removing the layer of the metallic conductor on the dielectric layer using chemical-mechanical polishing; and subjecting the exposed metallic conductor to a plasma which contains hydrogen or deuterium so as to passivate the metallic conductor. Preferably, the plasma contains a substance selected from the group consisting of: $NH_3$, $N_2H_2$, $H_2S$, and $CH_4$, and the metallic conductors are comprised of a material selected from the group consisting of: copper, copper doped aluminum, Ag, Sn, Pb, Ti, Cr, Mg, Ta, and any combination thereof. The electronic device is, preferably, a memory device, a logic device, a DSP, a microprocessor, a transistor, a diode, or any combination thereof.

DETAILED DESCRIPTION OF THE DRAWINGS

While the following description of the method of the instant invention is centered around a post-CMP passivation step of copper-containing structures, the instant invention can be implemented at any time (not just after a CMP operation) and can be utilized to passivate any material. Copper and copper doped aluminum are the most likely candidates for the method of the instant invention because oxidation of the copper renders it less conductive, and currently, post-CMP processing does not substantially prevent this oxidation.

Figure 1:
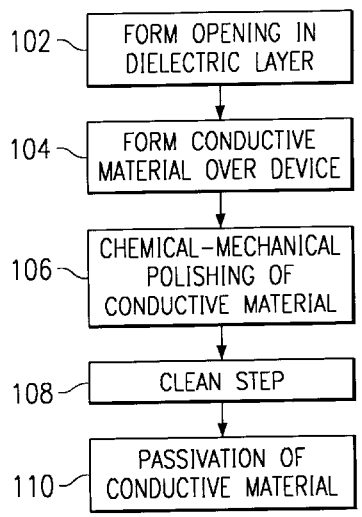
FIG. 1 is a flow diagram illustrating the method of one embodiment of the instant invention.
Figure 2A:
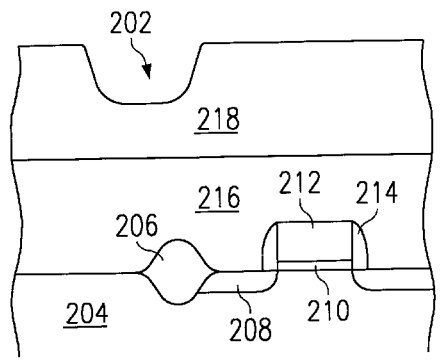
FIGS. 2a–2d are cross-sectional views of a portion of a partially fabricated electronic device, which is fabricated using the method of the instant invention as is illustrated in FIG. 1.

Referring to step 102 of FIG. 1 and FIG. 2a, source/drain regions 208 are formed in substrate 204 using conventional techniques. Isolation region 206 is also formed as either a field oxide, a shallow trench isolation, or any other type of isolation region which would be obvious to one of ordinary skill in the art. A gate structure is formed over the channel region and includes gate insulator 210, sidewall insulators 214 and conductive gate structure 212. An overlying dielectric layer 216 is formed over these structures and is preferably comprised of an oxide, a nitride, glass (either PSG or BPSG), or any other insulator. Vias may be formed through dielectric layer 216 so as to connect source/drain regions 208 or gate structure 212 to other circuit elements. Dielectric layer 218 is formed over dielectric layer 216. Preferably, dielectric layer 218 is comprised of an oxide (such as $SiO_2$), a nitride, a combination of an oxide and a nitride, BPSG, PSG, a dielectric with a low dielectric constant (such as HSQ aerogel, xerogel), or a combination thereof. An opening 202 may be formed from the top to the bottom of layer 218 to form an interconnect and/or a trench and/or a via may be formed in layer 218 so as to make a conductive line and/or via.

Figure 2B:
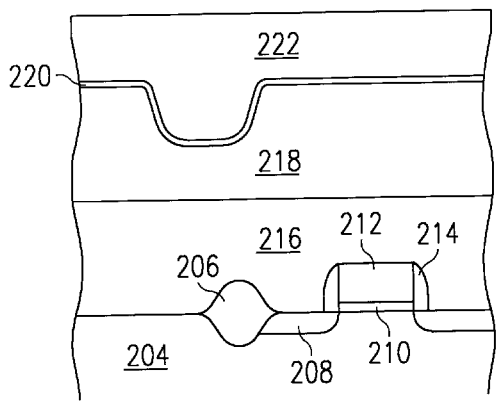

Referring to step 104 of FIG. 1 and FIG. 2b, a thin liner 220 is preferably formed on dielectric layer 218. Liner 220 is preferably comprised of TiN, Ti/TiN stack, or Ta, TaN, Ta/TaN, Ti/TaN, WN, Ti/WN, TiSiN and/or combinations thereof and preferably acts as a barrier so as to prevent any copper from leaching into dielectric layer 218. Next, conductor 222 is formed on liner 220 (if liner 220 is required and formed). Preferably, conductor 222 is comprised of substantially pure copper, copper doped aluminum (where the copper is at least 1 wt% of the combination), or any other oxygen-sensitive conductor, such as Ag, or copper alloyed with one of the following oxygen sensistive metals: Sn, Pb, Ti, Cr, Mg or Ta. Conductor 222 is preferably either sputtered (such as PVD) onto the wafer or deposited using CVD or electroplating or electroless plating, or a combination of these techniques.

Figure 2C:
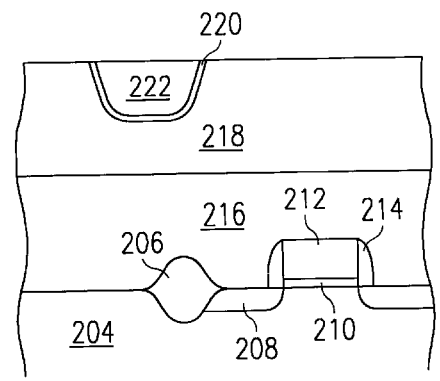

Referring to step 106 and FIG. 2c, a CMP step is performed so as to remove the portion of conductor 222 (and possibly liner/barrier 220) over dielectric layer 218 which is not within trench 202. Preferably, this is accomplished using standard CMP technology. Next, a clean step 108 is performed so as to remove any slurry residue and any other metallic particles. Preferably, this is accomplished using an aqueous process. A de-ionized water rinse is then performed.

Passivation step 110 is performed next so as to passivate at least exposed conductor 222. Using the method of the instant invention, the wafer is subjected to a hydrogen-containing plasma. Preferably, the wafer temperature during this step is on the order of 150 to 350° C. (more preferably around 240 to 250° C.) While a substantially pure hydrogen plasma is preferable, one or more forming gases (such as $N_2$ or Ar) can be added and/or deuterium or other hydrogen-containing gases such as $NH_3$, $N_2H_2$, $H_2S$, or $CH_4$, for example,. or deuterated forms of these gases, may be used instead of hydrogen.

Figure 2D:
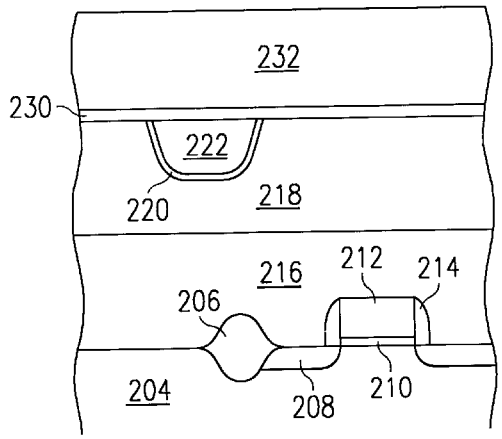

Referring to FIG. 2d, a nitride layer 230 may be formed directly after passivation step 110 so as to further prevent any oxidation of conductor 222 and liner 220. Dielectric layer 232 is formed next and may be comprised of another nitride, an oxide, TEOS, BPSG, PSG, or any lower dielectric constant material (such as aerogel, xerogel, polymers or HSQ).

In an alternative embodiment, a layer of copper-containing conductor is formed over a dielectric layer which is formed over a substrate. Preferably, the dielectric layer has holes formed within the layer and the copper-containing material is additionally formed within these (so as to create vias). Next, the copper-containing material is etched so as to form vias and interconnecting structures. Preferably, the etchant used will be a dry etchant (more specifically and etchant combined within a plasma). Next, the passivation step of the instant invention is performed using conditions as is described with reference to step 110 of FIG. 1).

Figure 3:
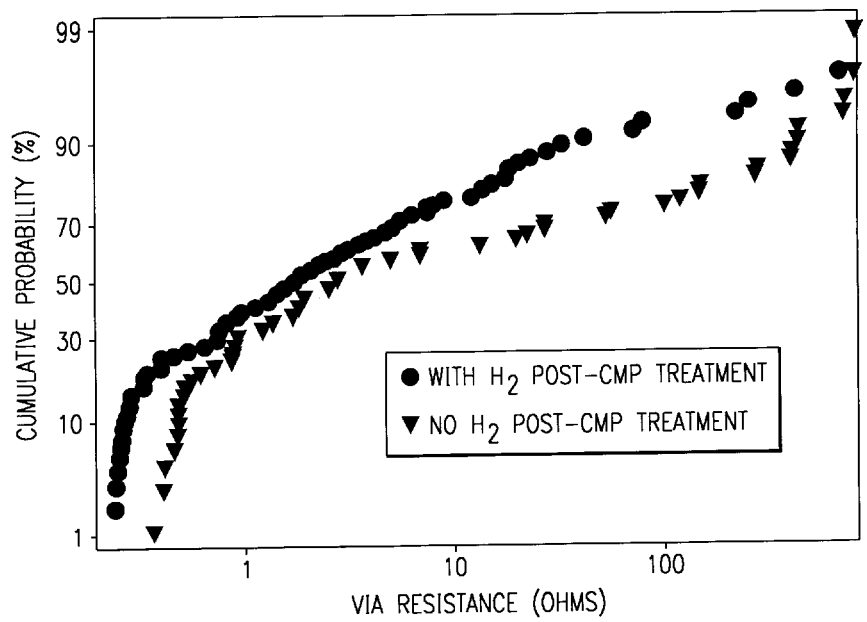
FIG. 3 is a graph illustrating resistivity of copper vias before and after the passivation step of the instant invention.

FIG. 3 is a graph illustrating the resistivity of copper vias before and after the passivation step of the instant invention. This graph shows that the resistivity of the copper via is less after the passivation step of the instant invention.

Figure 4:
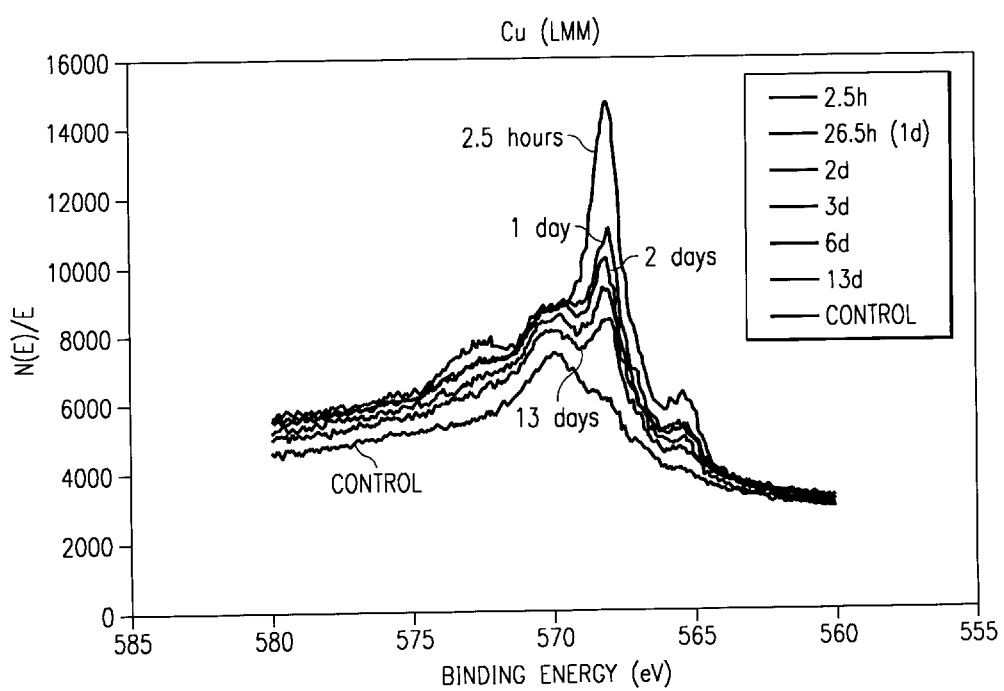
FIG. 4 is a graph of x-ray photoelectron spectroscopy data showing the Cu (LMM) Auger peaks just after $H_2$ passivation, and after intervals of 2.5 hours, and 1, 2, and 13 days of ambient room air exposure following the $H_2$ plasma exposure. A comparison with Cu which has been exposed only to the ambient is provided for comparison (no $H_2$ plasma exposure). The passivation effect persists even after two weeks in room air.

FIG. 4 shows x-ray photoelectron spectra obtained from the Cu (LMM) Auger region. The Cu (0) (metallic copper) (LMM) Auger peak has a binding energy of about 567 eV, while oxidized Cu (I) and Cu (II) (LMM) peak binding energy is about 569 eV. The control sample spectrum clearly shows mostly oxidized Cu. The spectrum labelled 2.5 hours was taken after a 120 s H2 plasma exposure. The wafer was exposed to the room ambient for approximately 2.5 hours prior to the acquisition of the XPS data. One clearly sees the dominant Cu (0) (LMM) peak. With increased ambient exposure, the Cu (0) feature decreases in size, but even after nearly two weeks of air exposure, the Cu (0) peak dominates the spectrum. This indicates that the passivation effect produced as a result of exposure to the $H_2$ plasma process (of the instant invention) is quite stable.

Although specific embodiments of the present invention are herein described, they are not to be construed as limiting the scope of the invention. Many embodiments of the present invention will become apparent to those skilled in the art in light of methodology of the specification. The scope of the invention is limited only by the claims appended.

What we claim is:

1. A method of forming an electronic device over a semiconductor substrate and having at least one level of metallic conductors, said method comprising the steps of:

forming source and drain regions in the semiconductor substrate;

forming a first dielectric layer over the semiconductor substrate and the source and drain regions;

forming a second dielectric layer over said first dielectric layer, said second dielectric layer having openings;

forming a layer of said metallic conductors on said second dielectric layer and in the openings wherein said metallic conductors do not contact said source and drain regions;

removing a portion of said layer of said metallic conductors on said second dielectric layer thereby creating exposed portions of the metallic conductors corresponding to the openings; and subjecting said exposed metallic conductors to a plasma which contains hydrogen or deuterium so as to passivate said metallic conductors.

2. The method of claim 1, wherein said plasma contains a substance selected from the group consisting of: $NH_3$, $N_2H_2$, $H_2S$, and $CH_4$.

3. The method of claim 1, wherein said metallic conductors are comprised of a material selected from the group consisting of: copper, copper doped aluminum, Ag, Sn, Pb, Ti, Cr, Mg, Ta, and any combination thereof.

4. The method of claim 1, wherein said electronic device is selected from the group consisting of: a memory device, a logic device, a DSP, a microprocessor, a transistor, a diode, and any combination thereof.

5. The method of claim 1, wherein said step of removing a portion of said layer of said metallic conductors is performed by sputtering.

6. The method of claim 1, wherein said step of removing a portion of said layer of said metallic conductors is performed by chemical-mechanical polishing.

7. The method of claim 1, wherein said step of removing a portion of said layer of said metallic conductors is performed by etching.

8. A method of forming an electronic device over a semiconductor substrate and having at least one level of metallic conductors, said method comprising the steps of:

forming source and drain regions in the semiconductor substrate;

forming a first dielectric layer over the semiconductor substrate and the source and drain regions;

forming a second dielectric layer over said first dielectric layer, said second dielectric layer having openings;

forming a layer of said metallic conductors in said openings in said second dielectric layer and on said second dielectric layer wherein said metallic conductors do not contact said source and drain regions;

removing said layer of said metallic conductors on said second dielectric layer using chemical-mechanical polishing thereby creating exposed portions of the metallic conductors corresponding to the openings; and subjecting said exposed metallic conductors to a plasma which contains hydrogen or deuterium so as to passivate said metallic conductors.

9. The method of claim 8, wherein said plasma contains a substance selected from the group consisting of: $NH_3$, $N_2H_2$, $H_2S$, and $CH_4$.

10. The method of claim 8, wherein said metallic conductors are comprised of a material selected from the group consisting of: copper, copper doped aluminum, Ag, Sn, Pb, Ti, Cr, Mg, Ta, and any combination thereof.

11. The method of claim 8, wherein said electronic device is selected from the group consisting of: a memory device, a logic device, a DSP, a microprocessor, a transistor, a diode, and any combination thereof.

* * * * *